(12) United States Patent
Chung (10) Patent No.: US 7,880,694 B2
(45) Date of Patent: Feb. 1, 2011

(54) EMISSION DRIVER AND ELECTROLUMINESCENT DISPLAY INCLUDING SUCH AN EMISSION DRIVER

(75) Inventor: Bo-yong Chung, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 812 days.

(21) Appl. No.: 11/896,025

(22) Filed: Aug. 29, 2007

(65) Prior Publication Data

US 2008/0055208 A1 Mar. 6, 2008

(30) Foreign Application Priority Data

Aug. 31, 2006 (KR) ...................... 10-2006-0083755

(51) Int. Cl.
*G09G 3/30* (2006.01)
(52) U.S. Cl. .................... 345/76; 345/206; 345/211; 345/690; 315/161; 315/169.3; 315/195; 315/299; 327/387; 327/389; 327/391
(58) Field of Classification Search ............. 345/76–82, 345/206, 211–214, 690; 315/161–164, 169.3, 315/170, 195–199, 299; 327/387, 389, 390, 327/391
See application file for complete search history.

(56) References Cited

U.S. PATENT DOCUMENTS

| | | | |
|---|---|---|---|
| 5,781,168 A | 7/1998 | Osada et al. | |
| 5,949,271 A * | 9/1999 | Fujikura | ..................... 327/390 |
| 6,072,477 A | 6/2000 | Ueno | |
| 6,720,942 B2 * | 4/2004 | Lee et al. | ....................... 345/82 |
| 6,724,376 B2 | 4/2004 | Sakura et al. | |
| 7,352,786 B2 * | 4/2008 | Ikeda | ....................... 372/38.01 |
| 7,420,535 B2 * | 9/2008 | Senda | ......................... 345/100 |
| 7,468,723 B1 * | 12/2008 | Collins | ....................... 345/102 |
| 7,554,513 B2 * | 6/2009 | Sun et al. | ....................... 345/77 |
| 7,710,368 B2 | 5/2010 | Chung | |
| 2005/0141320 A1 | 6/2005 | Senda | |
| 2006/0156121 A1 | 7/2006 | Chung | |

FOREIGN PATENT DOCUMENTS

| | | |
|---|---|---|
| JP | 2001-326569 | 11/2001 |
| JP | 2003-122304 | 4/2003 |
| KR | 10-2005-0002583 A | 1/2005 |
| KR | 10-2005-0065442 A | 6/2005 |
| KR | 10-2005-0122690 A | 12/2005 |
| KR | 10-2006-0081582 A | 7/2006 |

* cited by examiner

*Primary Examiner*—Henry N Tran
(74) *Attorney, Agent, or Firm*—Lee & Morse, P.C.

(57) ABSTRACT

An emission driver may include a first signal processor adapted to receive a clock signal, an input signal and an inverse input signal, and generate a first output signal, a second signal processor adapted to receive the first output signal, an inverse clock signal and negative feedback signals, and generate a second output signal, a third signal processor adapted to receive the second output signal and the input signal, and generate a third output signal that is an inverse of the second output signal based on the input signal, a fourth signal processor adapted to receive the second output signal, and generate a fourth output signal based on the second output signal, the fourth output signal being an inverse signal of the third output signal, and a fifth signal processor adapted to receive the fourth output signal and output a fifth output signal based on a stored predetermined voltage.

20 Claims, 5 Drawing Sheets

EMISSION DRIVER AND ELECTROLUMINESCENT DISPLAY INCLUDING SUCH AN EMISSION DRIVER

BACKGROUND OF THE INVENTION

1. Field of the Invention

The present invention relates to an emission driver and an electroluminescent display employing such an emission driver. More particularly, the present invention relates to an emission driver and an electroluminescent display, e.g., an organic electroluminescent display, employing such an emission driver that can be made to be smaller, lighter and less costly by forming the emission driver with a P-type transistor, e.g., a PMOS transistor, or a N-type transistor, e.g., a NMOS transistor.

2. Description of the Related Art

A flat panel display device may include a plurality of pixels arranged on a substrate in an array to form a display region, and scan lines and data lines may be coupled to each pixel for selectively applying data signals to the pixels in order to display an image.

Flat panel display devices may be categorized into passive matrix type emission display devices and active matrix type emission display devices based on a driving scheme for driving the pixels. The active matrix type displays generally provide improved resolution, contrast and an operation speed.

Flat panel display devices are being used as a display device for portable information terminals such as personal computers, mobile telephones, PDAs, etc., or as a monitor for various types of information equipment. Various types of flat panel display devices are known, e.g., liquid crystal displays (LCD) using liquid crystal panels, organic electroluminescent displays using organic light emitting elements, and plasma display devices (PDPs) using plasma panels.

Various emission display devices that are relatively light weight and occupy a relatively small volume as compared to cathode ray tubes are being developed, and electroluminescent displays, e.g., organic electroluminescent displays, which are capable of having excellent emission efficiency, brightness, viewing angle and relatively rapid response speeds are being researched and developed.

In conventional electroluminescent displays, e.g., organic electroluminescent displays, the emission driver employs both PMOS transistors and NMOS transistors. However, when a pixel unit of the electroluminescent display is formed only with PMOS transistor(s) or NMOS transistor(s), the pixel unit may be formed on a separate external driver and/or an additional process may be required for the emission driver if the emission driver is implemented using both PMOS transistors and NMOS transistors. Thus, such electroluminescent displays may be relatively large in size, may be relatively heavy, and manufacturing thereof may be complicated.

SUMMARY OF THE INVENTION

The present invention is therefore directed to an emission driver and an electroluminescent display, e.g., an organic electroluminescent display, including such an emission driver, which substantially overcome one or more of the problems due to the limitations and disadvantages of the related art.

It is therefore a feature of an embodiment of the present invention to provide an emission driver and an electroluminescent display, e.g., organic electroluminescent display, including such an emission driver, which include a pixel unit together with an emission driver that include only with p-type transistors, e.g., PMOS transistors, or n-type transistors, e.g., NMOS transistors, thereby simplifying a process for obtaining a smaller and less-costly emission driver and/or electroluminescent display.

At least one of the above and other features and advantages of the present invention may be realized by providing an emission driver, including a first signal processor adapted to receive a clock signal, an input signal and an inverse input signal, and to generate a first output signal, a second signal processor adapted to receive the first output signal, an inverse clock signal and negative feedback signals, and to generate a second output signal, a third signal processor adapted to receive the second output signal and the input signal, and to generate a third output signal that is an inverse of the second output signal based on the input signal, a fourth signal processor adapted to receive the second output signal, and to generate a fourth output signal based on the second output signal, the fourth output signal being an inverse signal of the third output signal, and a fifth signal processor adapted to receive the fourth output signal, and to output a fifth output signal based on a stored predetermined voltage, wherein the fifth output signal may be an inverse of the fourth output signal, and the negative feedback signals may include the third output signal and the fourth output signal.

The first output signal may correspond to the inverse input signal delayed for a predetermined period of time. The second output signal may correspond to the first output signal corrected based on at least one of the negative feedback signals. The fifth signal processor may include a plurality of transistors, and the predetermined voltage may be at least a threshold voltage of one of the plurality of transistors arranged between an output terminal of the emission driver from which the fifth output signal is supplied and a ground power source such that when the fifth output signal is at a low level, a voltage thereof is a voltage of the ground power source.

The first signal processor may include a first transistor adapted to control a supply of a driving source voltage corresponding to a driving power source based on the clock signal, a second transistor adapted to control the supply of the driving power source voltage supplied through the first transistor to a first node based on the input signal, a third transistor adapted to control current flow from the first node to a ground power source based on a voltage of a gate electrode thereof, a fourth transistor coupled between a source electrode and the gate electrode of the third transistor, and adapted to control a voltage between the source electrode and the gate electrode of the third transistor based on the input signal, a fifth transistor adapted to control a voltage of the gate electrode of the third transistor based on the inverse input signal, a sixth transistor coupled between the third transistor and the ground power source, and adapted to perform a switching operation based on the clock signal, and a first capacitor adapted to store a voltage corresponding to the gate electrode of the third transistor.

The second signal processor may include a seventh transistor coupled to a driving power source and adapted to perform a switching operation based on the inverse clock signal, an eighth transistor adapted to perform a switching operation based on the third output signal to transfer a driving source voltage corresponding to the driving power source supplied through the seventh transistor to a first node, a ninth transistor adapted to allow current to flow from a second node to a ground power source based on a voltage applied to a gate electrode thereof, a tenth transistor coupled between a source electrode and the gate electrode of the ninth transistor, and adapted to perform a switching operation based on the input signal to control a voltage between the source and the gate terminals of the ninth transistor, an eleventh transistor adapted to control the voltage of the gate electrode of the ninth transistor based on the fourth output signal, a twelfth transistor adapted to perform a switching operation based on the inverse clock signal to allow current to flow between the ninth transistor and the ground power source, and a second capacitor adapted to store the voltage of the gate electrode of the ninth transistor.

The third signal processor may include a thirteenth transistor adapted to perform a switching operation based on the second output signal to allow a voltage of a driving power source to be supplied to a third node, and a fourteenth transistor adapted to perform a switching operation based on the input signal to allow current to flow from the third node to a ground power source.

The fourth signal processor may include a fifteenth transistor adapted to perform a switching operation based on the third output signal to allow a voltage of a driving power source to be supplied to a fourth node, and a sixteenth transistor adapted to perform a switching operation based on the second output signal to allow current to flow from the fourth node to a ground power source.

The fifth signal processor may include a seventeenth transistor adapted to perform a switching operation based on the fourth output signal to supply a voltage corresponding to a driving power source to an output terminal of the emission driver, an eighteenth transistor adapted to perform a switching operation based on the third output signal to allow current to flow from the output terminal to a ground power source, and a third capacitor adapted to store the predetermined voltage such that when the eighteenth transistor is in an on state and the seventeenth transistor is in an off state, a voltage of the output terminal is a voltage of the ground power source based on the predetermined voltage stored in the capacitor.

The first, second, third, fourth and fifth signal processors may include a plurality of transistors and the plurality of transistors are all one of p-type transistors and/or n-type transistors such that the first, second, third, fourth and fifth signal processors all include the same type of transistors.

At least one of the above and other features and advantages of the present invention may be separately realized by providing an electroluminescent display including a pixel unit adapted to display an image based on at least one pixel formed in a region defined by a data line, a scan line and an emission control line, a data driver adapted to transfer a data signal to the data line, a scan driver adapted to transfer a scan signal to the scan line, and an emission driver adapted to transfer an emission control signal to the emission control line, wherein the emission driver includes a first signal processor adapted to receive a clock signal, an input signal and an inverse input signal, and to generate a first output signal, a second signal processor adapted to receive the first output signal, an inverse clock signal and negative feedback signals, and to generate a second output signal, a third signal processor adapted to receive the second output signal and the input signal, and to generate a third output signal that is an inverse of the second output signal based on the input signal, a fourth signal processor adapted to receive the second output signal, and to generate a fourth output signal based on the second output signal, the fourth output signal being an inverse signal of the third output signal, and a fifth signal processor adapted to receive the fourth output signal, and to output a fifth output signal based on a stored predetermined voltage, wherein the fifth output signal may be an inverse of the fourth output signal, and the negative feedback signals may include the third output signal and the fourth output signal. The electroluminescent display may be an organic electroluminescent display.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 2006-0083755, filed on Aug. 31, 2006, in the Korean Intellectual Property Office, and entitled: "Emission Driver and Organic Electroluminescent Display Thereof," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

Hereinafter, exemplary embodiments of the present invention will be described in a more detailed manner with reference to the accompanying drawings.

Figure 1:
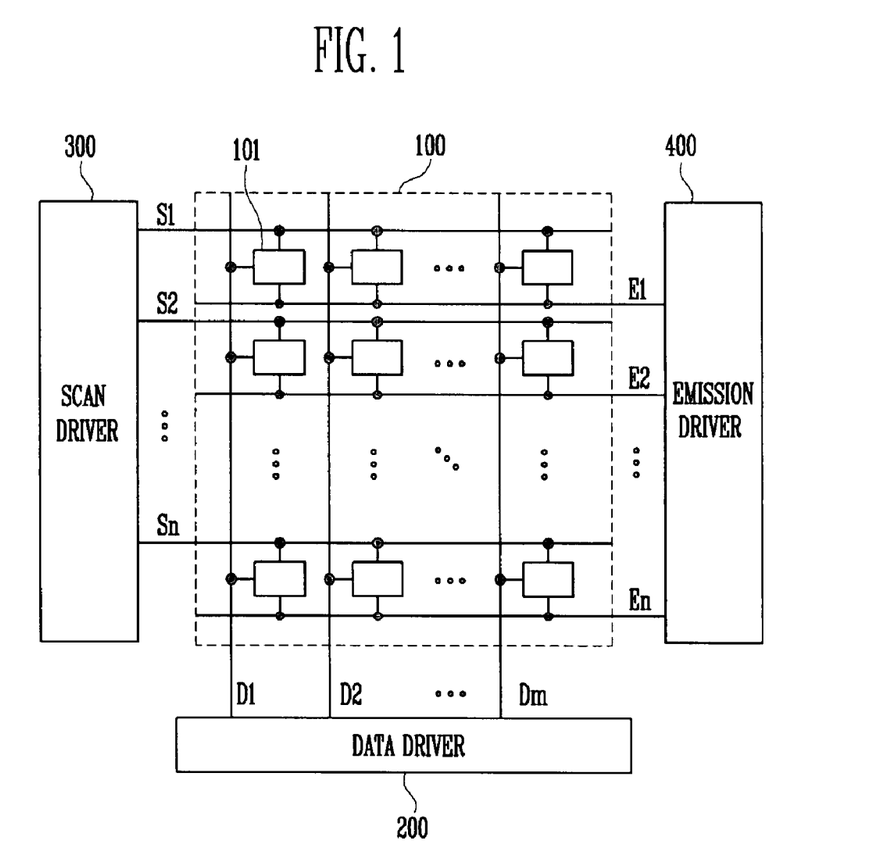
FIG. 1 illustrates a block diagram of an exemplary electroluminescent display according to an exemplary embodiment of the present invention.

FIG. 1 illustrates a block diagram of an exemplary electroluminescent display according to an exemplary embodiment of the present invention. The electroluminescent display may be, e.g., an organic electroluminescent display.

Referring to FIG. 1, a display may include a pixel unit 100, a data driver 200, a scan driver 300 and an emission driver 400.

The pixel unit 100 may include a plurality of data lines D1, D2 ... Dm−1, Dm, a plurality of scan lines S1, S2 ... Sn−1, Sn, a plurality of emission control lines E1, E2 ... En−1, En, and a plurality of pixels 101 formed in the region defined by the plurality of data lines D1, D2 ... Dm−1, Dm, the plurality of scan lines S1, S2 ... Sn−1, Sn, and the plurality of emission control lines E1, E2 ... En−1, En.

The pixel(s) 101 may include a pixel circuit and an organic light emitting element, and may generate a pixel current flowing into the pixel via data signals transferred through the plurality of the data lines D1, D2 ... Dm−1, Dm and scan signals transferred through the plurality of the scan lines S1, S2 ... Sn−1, Sn, in the pixel circuit. Each of the pixels may control the pixel current flowing to the respective organic light emitting element via emission control signals transferred through the plurality of emission control lines E1, E2 . . . En−1, En.

The data driver 200, which may be coupled to the plurality of data lines D1, D2 . . . Dn−1, Dm, may generate data signals and may sequentially transfer the data signal corresponding to one row of the pixel unit 100 to the plurality of data lines D1, D2 . . . Dm−1, Dm.

The scan driver 300, which may be coupled to the plurality of scan lines S1, S2 . . . Sn−1, Sn, may generate scan signals and may transfer them to the plurality of scan lines S1, S2 . . . Sn−1, Sn. A particular row may be selected by the scan signal, and the data signal may be transferred to the pixel 101 associated with, e.g., arranged in, the selected row, generating the current corresponding to the data signal in the respective pixel 101.

The emission driver 400, which may be coupled to the plurality of emission control lines E1, E2 . . . En−1, En, may generate emission control signals and may transfer them to the plurality of emission control lines E1, E2 . . . En−1, En. The emission driver 400 may control a pulse width and a number of pulses of the respective emission control signal(s). The pixel(s) 101 coupled to the emission control lines E1, E2 . . . En−1, En may receive the respective emission control signals to determine when the current generated in the pixel 101 is to flow into the light emitting element. In some embodiments of the invention, the emission driver 400 may be implemented as a circuit employing only one-type of transistor, e.g., p-type transistor such as PMOS transistors, and thus, when the pixel unit 100 is formed, the pixel unit 100 need not be formed on, e.g., a substrate using a separate process or a separate chip.

Figure 2:
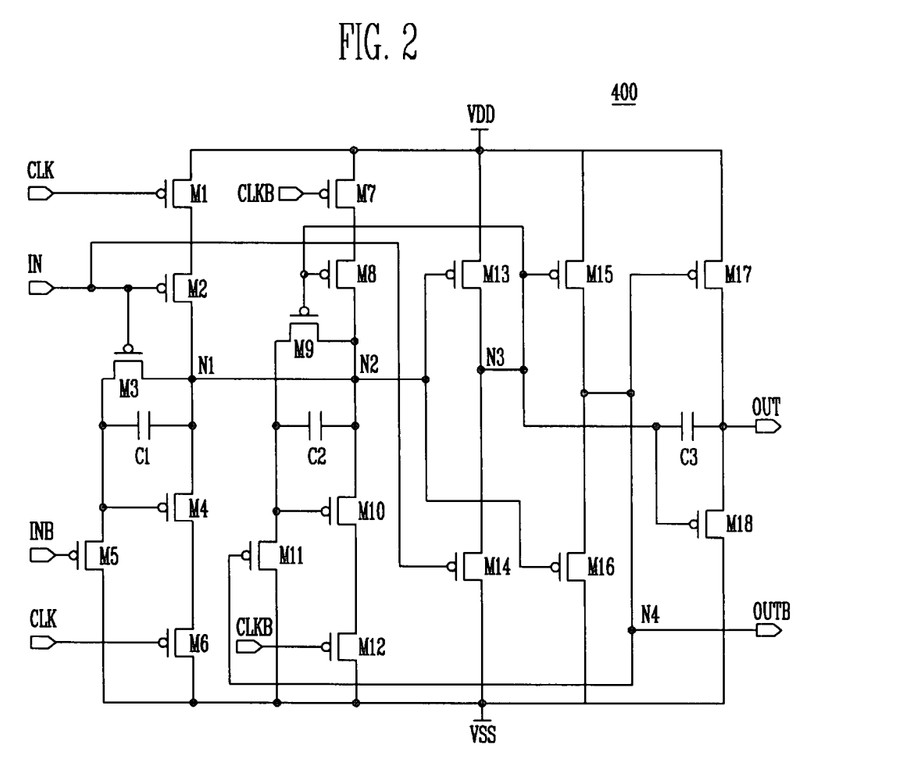
FIG. 2 illustrates a circuit diagram of a first exemplary embodiment of an emission driver employable by the display of FIG. 1.

FIG. 2 illustrates a circuit diagram of a first exemplary embodiment of an emission driver employable by the display shown in FIG. 1.

Figure 3:
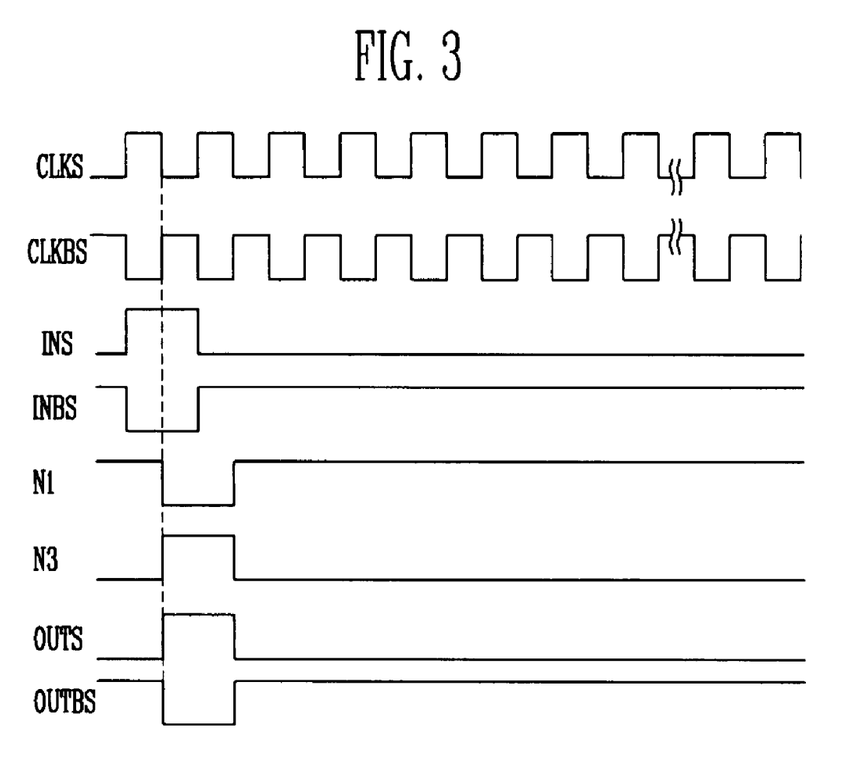
FIG. 3 illustrates a timing diagram of an exemplary operation of the emission driver of FIG. 2.

Referring to FIG. 2, the emission driver 400 may include a first signal processor, a second signal processor, a third signal processor, a fourth signal processor and a fifth signal processor, and may operate by receiving a clock signal CLKS, an inverse clock signal CLKBS, an input signal INS and an inverse input signal INBS (see FIG. 3). However, embodiments of the invention are not limited to an emission driver including first, second, third, fourth and fifth signal processors.

The first signal processor may include a first transistor M1, a second transistor M2, a third transistor M3, a fourth transistor M4, a fifth transistor M5, a sixth transistor M6, and a first capacitor C1.

A source terminal of the first transistor M1 may be coupled to a driving power source VDD, a drain terminal of the first transistor M1 may be coupled to a source terminal of the second transistor M2, and a gate terminal of the first transistor M1 may be coupled to a clock terminal CLK.

A drain terminal of the second transistor M2 may be coupled to a first node N1. A gate terminal of the second transistor M2 may be coupled to an input signal terminal IN.

A source terminal of the third transistor M3 may be coupled to the first node N1. A drain terminal of the third transistor M3 may be coupled to a source terminal the fifth transistor M5. A gate terminal of the third transistor M3 may be coupled to an input terminal IN.

A source terminal of the fourth transistor M4 may be coupled to the first node N1. A drain terminal of the fourth transistor M4 may be coupled to a source electrode of the sixth transistor M6. A gate terminal of the fourth transistor M4 may be coupled to the source electrode of the fifth transistor M5.

A drain terminal of the fifth transistor M5 may be coupled to a ground power source VSS. A gate electrode of the fifth transistor M5 may be coupled to an inverse input signal terminal INB.

A drain electrode of the sixth transistor M6 may be coupled to the ground power source VSS. A gate electrode of the sixth transistor M6 may be coupled to the clock terminal CLK.

A first terminal of the first capacitor C1 may be coupled to the first node N1. A second terminal of the first capacitor C1 may be coupled to the gate terminal of the fourth transistor M4 and the source terminal of the fifth transistor M5.

The second signal processor may include a seventh transistor M7, an eighth transistor M8, a ninth transistor M9, a tenth transistor M10, an eleventh transistor M1, a twelfth transistor M12 and a second capacitor C2.

A source terminal of the seventh transistor M7 may be coupled to the driving power source VDD. A drain terminal of the seventh transistor M7 may be coupled to a source terminal of the eighth transistor M8. A gate terminal of the seventh transistor M7 may be coupled to an inverse clock terminal CLKB.

A drain terminal of the eighth transistor M8 may be coupled to a second node N2. A gate terminal of the eighth transistor M8 may be coupled to a gate terminal of the ninth transistor M9. A drain terminal of the eighth transistor M8 may be coupled to the second node N2. The second node N2 may be coupled to the first node N1 of the first signal processor. The first node N1 may supply an output signal of the first signal processor and the second node N2 may supply an output signal of the second signal processor.

A source terminal of the ninth transistor may be coupled to the second node N2. A drain terminal of the ninth transistor may be coupled to a gate electrode of the tenth transistor M10, a source electrode of the eleventh transistor M11, and a second terminal of the second capacitor C2. A first terminal of the second capacitor C2 may be coupled to the second node N2.

A source electrode of the tenth transistor M10 may be coupled to the second node N2. A drain electrode of the tenth transistor M10 may be coupled to a source electrode of the twelfth transistor M12.

A gate electrode of the eleventh transistor M11 may be coupled to a fourth node N4. A drain electrode of the eleventh transistor M11 may be coupled to the ground power source VSS.

A gate terminal of the twelfth transistor M12 may be coupled to inverse clock terminal CLKB. A drain terminal of the twelfth transistor M12 may be coupled to the ground power source VSS.

The third signal processor may include a thirteenth transistor M13 and a fourteenth transistor M14. A source terminal of the thirteenth transistor may be coupled to the driving power source VDD. A drain terminal of the thirteenth transistor M13 may be coupled to a third node N3. The third node N3 may supply an output signal of the third signal processor. A gate terminal of the thirteenth transistor M13 may be coupled to the second node N2. A source terminal of the fourteenth transistor M14 may be coupled to the third node N3. A drain terminal of the fourteenth transistor M14 may be coupled to the ground power source VSS. A gate terminal of the fourteenth transistor M14 may be coupled to the input signal terminal IN.

The fourth signal processor may include a fifteenth transistor M15 and a sixteenth transistor M16. A source terminal of the fifteenth transistor M15 may be coupled to the driving power source VDD. A drain terminal of the fifteenth transistor M15 may be coupled to a source terminal of the sixteenth transistor M16 and the drain terminal of the fifteenth transistor M15 and the source terminal of the sixteenth transistor M16 may be coupled to the fourth node N4. The fourth node N4 may supply an output signal of the fourth signal processor. A gate terminal of the fifteenth transistor M15 may be coupled to the third node N3. A drain terminal of the sixteenth transistor M16 may be coupled to the ground power source VSS. A gate terminal of the sixteenth transistor M16 may be coupled to the second node N2.

The fifth signal processor may include a seventeenth transistor M17, an eighteenth transistor M18 and a third capacitor C3. A source terminal of the seventeenth transistor M17 may be coupled to the driving power source VDD. A drain terminal of the seventeenth transistor M17 may be coupled to an output terminal OUT. A gate terminal of the seventeenth transistor M17 may be coupled to the fourth node N4. A source terminal of the eighteenth transistor M18 may be coupled to the output terminal OUT. A drain terminal of the eighteenth transistor M18 may be coupled to the ground power source VSS. A gate terminal of the eighteenth transistor M18 may be coupled to the third node N3. A first terminal of the third capacitor C3 may be coupled to the third node N3. A second terminal of the third capacitor C3 may be coupled to the source of the eighteenth transistor 18, and the second electrode may be coupled to the output terminal OUT.

In some embodiments of the invention, each of the first to the eighteenth transistors M1 to M18 included in the first to fifth signal processors may be implemented as a p-type transistor, e.g., a PMOS transistor. However, embodiments of the invention are not limited to p-type transistors.

FIG. 3 illustrates a timing diagram of an exemplary operation of the emission driver 400 shown in FIG. 2.

Referring to FIGS. 2 and 3, and as discussed above, the emission driver 400 may include the first signal processor, the second signal processor, the third signal processor and the fourth signal processor.

The first signal processor may receive the clock signal CLKS, the input signal INS and the inverse input signal INBS. The second signal processor may receive the inverse clock signal CLKBS and an output signal of the first signal processor, and may receive an output signal of the third signal processor and an output signal of the fourth signal processor via negative feedback, e.g., the output signal of the third signal processor and the output signal of the fourth signal processor may be fed-back to the second signal processor. The third signal processor may receive an output signal of the second signal processor via the second node N2 and the input signal INS via the input signal terminal IN. The fourth signal processor may receive the output signal of the second signal processor via the second node N2 and the output signal of the third signal processor via the third node N3. The output signal of the fourth signal processor may be output through an inverse output terminal OUTB, which may correspond to the fourth node N4. The fifth signal processor may receive the output signal of the third signal processor and the output signal of the fourth signal processor. The output signal of the fifth signal processor may be output through the output terminal OUT of the emission driver 400.

In the first signal processor, when the clock signal CLKS is at a low state, the input signal INS is at a low state and the inverse input signal INBS is at a high state, the fifth transistor M5 may be in an off state, the first transistor M1, the second transistor M2, the third transistor M3 and the sixth transistor M6 may be in an on state. As a result of the first and second transistors M2, M3 being in an on state, a voltage corresponding to the driving power source VDD may be transferred to the first node N1. At this time, the gate and source terminals of the fourth transistor M4 may have a same voltage by way of the third transistor M3 and thus, the fourth transistor M4 may interrupt current flowing in a direction from the source to the drain terminals thereof, i.e., to the sixth transistor M6. Therefore, a voltage of the first node N1 may correspond to, e.g., be maintained at, the voltage of the driving power source VDD. As a result of no current flowing through the fourth transistor M4, power consumption of the emission driver 400 may also be reduced.

When the clock signal CLKS is at a high state, the inverse clock signal CLKBS is at a low state, the input signal INS is at a high state and the inverse input signal INBS is at a low state, the first transistor M1, the second transistor M2, the third transistor M3 and the sixth transistor M6 may be in an off state, and the fifth transistor M5 may be in an on state and may lower a voltage of the gate terminal of the fourth transistor M4. Under such circumstances, no current may flow into the fourth transistor M4 as the sixth transistor M6 may be in an off state. Thus, if, e.g., the voltage at the first node N1 corresponded to the voltage of the driving power source VDD prior to clock signal CLKS and the input signal INS being at a high state, the first node N1 may be maintained at the voltage of the driving power source VDD. Also, under such circumstances, because no current may flow into the fourth transistor M4 power consumption may be reduced, e.g., by interrupting a path of current flow, i.e., charge dissipation, to the ground power source VSS.

Referring still to FIG. 3, when the clock signal CLKS is at a low state, e.g., transitions to the low state, the input signal INS is at a high state, e.g., maintains a high state, and the inverse input signal INBS is at a low state, e.g., transitions to the low state, the first transistor M1, the fifth transistor M5 and the sixth transistor M6 may be in an on state, the second transistor M2 and the third transistor M3 may be in an off state, the gate terminal of the fourth transistor M4 may be in a low state by way of the fifth transistor M5 and a voltage of the first node N1 may drop to a voltage of the ground power source VSS through the fourth transistor M4 and the sixth transistor M6. At this time, when the clock signal CLKS transitions to a high state and the input signal INS transitions to a low state, the first transistor M1, the fifth transistor M5 and the sixth transistor M6 may be in an off state, the second transistor M2 and the third transistor M3 may be in an on state, and the first node N1 may have a voltage corresponding to the ground power source VSS, e.g., maintain the voltage of the ground power source VSS.

Next, when the clock signal CLKS is at a low state, e.g., transitions to the low state, and the input signal INS is at a low state, e.g., maintains the low state, the first transistor M1, the second transistor M2, the third transistor M3 and the sixth transistor M6 may be in an on state, the fifth transistor M5 may be in an off state, the fourth transistor M4 may be diode coupled, i.e., the gate and source terminals of the fourth transistor M4 may be coupled, by way of the third transistor M3 and the first node N1 may have a voltage corresponding to the driving power source VDD.

Referring now to the second signal processor, the second signal processor may receive the voltage of the first node N1 corresponding to the output signal of the first signal processor, voltage(s) of the negative feedback signal(s) from the third and/or fourth signal processors, e.g., the voltage of the third node N3 and the voltage of the fourth node N4 corresponding to the inverse output signal terminal OUTB, and the inverse clock signal CLKBS.

Next, when the inverse clock signal CLKBS is at a high state, the first node N1 of the first signal processor has a voltage corresponding to the driving power source VDD, e.g., maintains the voltage of the driving power source VDD, and the voltage of the output terminal OUT is at a low state, e.g., maintains the low state, the seventh transistor M7 and the twelfth transistor M12 may be in an off state, and the eighth transistor M8 and the ninth transistor M9 be in an on state. Under such circumstances, the eleventh transistor M11 may be in an off state by way of a voltage at the inverse output terminal OUTB. At this time, as a result of the ninth transistor M9, the tenth transistor M10 may interrupt current flow in a direction from the source terminal to the drain terminal thereof and a voltage of the second node N2 may be maintained.

When the eleventh transistor M11 is in an on state as a result of, e.g., the voltage at the inverse output terminal OUTB, which may be negatively fed back to the eleventh transistor M11, and the twelfth transistor M12 is in an on state by way of, e.g., the inverse clock signal CLKBS, the voltage at the second node N2 may drop to the voltage of the ground power source VSS, and may reduce power consumption of the emission driver 400.

Referring now to the third signal processor, the third signal processor may receive the input signal INS and the output signal of the second signal processor by way of the second node N2. When the input signal INS is at a high state and the output signal of the second signal processor is at a low state, the thirteenth transistor M13 may be in an on state and may transfer a voltage of the driving power source VDD to the third node N3. When the input signal INS is at a low state and the output signal of the second signal processor is at a high state, the fourteenth transistor M14 may be in an on state, current may flow from the third node N3 to the ground power source VSS, the voltage of the third node N3 may be lowered and a voltage at the output terminal OUT may be at a low voltage state, e.g., drop to a low voltage. Thereafter, if the output of the second signal processor is at a high state and the input signal INS is at a low state, the third node N3 may be at a low voltage, e.g., maintain the low voltage.

Referring to the fourth signal processor, the fourth signal processor may receive the output signal of the second signal processor and the output signal of the third signal processor. At this time, because the output signal of the second signal processor may be inversed relative to the output signal of the third signal processor, when the fifteenth transistor M15 is in an on state, the sixteenth transistor M16 may be in an off state, and when the fifteenth transistor M15 is in an off state, the sixteenth transistor M16 may be in an on state. Therefore, the output of the fourth signal processor, i.e., the voltage at the fourth node N4 between the fifteenth transistor M15 and the sixteenth transistor M16 may have a voltage of corresponding to an inverse of the output of the third signal processor, i.e., voltage at the third node N3.

Referring to the fifth signal processor, the fifth signal processor may receive the output signal from the fourth signal processor, i.e., voltage at the fourth node N4, and the voltage of the fourth node N4 may be applied to the gate terminal of the seventeenth transistor M17. When the seventeenth transistor M17 is in an on state, e.g., when the output of the fourth signal processor is at a low state, the seventeenth transistor M17 may transfer the voltage of the driving power source VDD to the output terminal OUT. In such cases, when the voltage of the fourth node N4 corresponding to the output of the fourth signal processor is at a high state, the seventeenth transistor M17 may interrupt the supply of the voltage of the driving power source VDD to the output terminal OUT.

The eighteenth transistor M18 may receive the output of the third signal processor via the gate terminal thereof. When the output signal of the third signal processor is in a high state, the output of the fourth signal processor, which may be an inverse signal of the output signal third signal processor, may be in a low state signal and thus, the seventh transistor M17 may be in an on state and the voltage of the output terminal OUT may be in a high state by receiving the voltage of the driving power source VDD. Under such circumstances, as a result of the output signal of the third signal processor, the voltage at the gate terminal of the eighteenth transistor M18 may be in a high state and current may not flow through the eighteenth transistor M18, and thus, the voltage at the output terminal OUT may be at the high state by way of the seventeenth transistor M17 and the driving power source VDD.

When the output signal of the third signal processor is in a low state and the output signal of the fourth signal processor is in a high state, the seventeenth transistor M17 may be in an off state and may interrupt the flow between the driving power source VDD and the output terminal OUT, and the eighteenth transistor M18 may be in a low state and may allow current to flow from the output terminal OUT to the ground power source VSS, thereby lowering the voltage of the output terminal OUT. At this time, in cases in which the third capacitor C3 is not provided, if the voltage of the output terminal OUT is continuously lowered by the current flowing to the ground power source VSS, the voltage of the gate and the source terminals of the eighteenth transistor M18 may be the same so that the voltage at the output terminal OUT may not drop to a voltage lower than a threshold voltage of the eighteenth transistor M18. However, the threshold voltage of the eighteenth transistor M18 may be stored by the third capacitor C3, the eighteenth transistor M18 may allow current to flow to the ground power source VSS from the output terminal OUT so that the voltage of the output terminal OUT may drop to the voltage of the ground power source VSS. Therefore, embodiments of the invention may enable static current to be reduced and the output signal(s) output from the output terminal OUT may have improved and/or excellent signal characteristics.

In embodiments of the invention, if a width of a pulse of the input signal INS is long by way of the operation of the first to fifth signal processors, a width of a pulse of the output signal OUTS may be long, and if a width of a pulse of the input signal INS is short, a width of a pulse of the output signal OUTS may be short. A number of pulses of the input signal INS may be identical to a number of pulses of the output signal OUTS so that a width of pulse(s) of the emission control signal and the number thereof may be controlled using the input signal INS.

Figure 4:
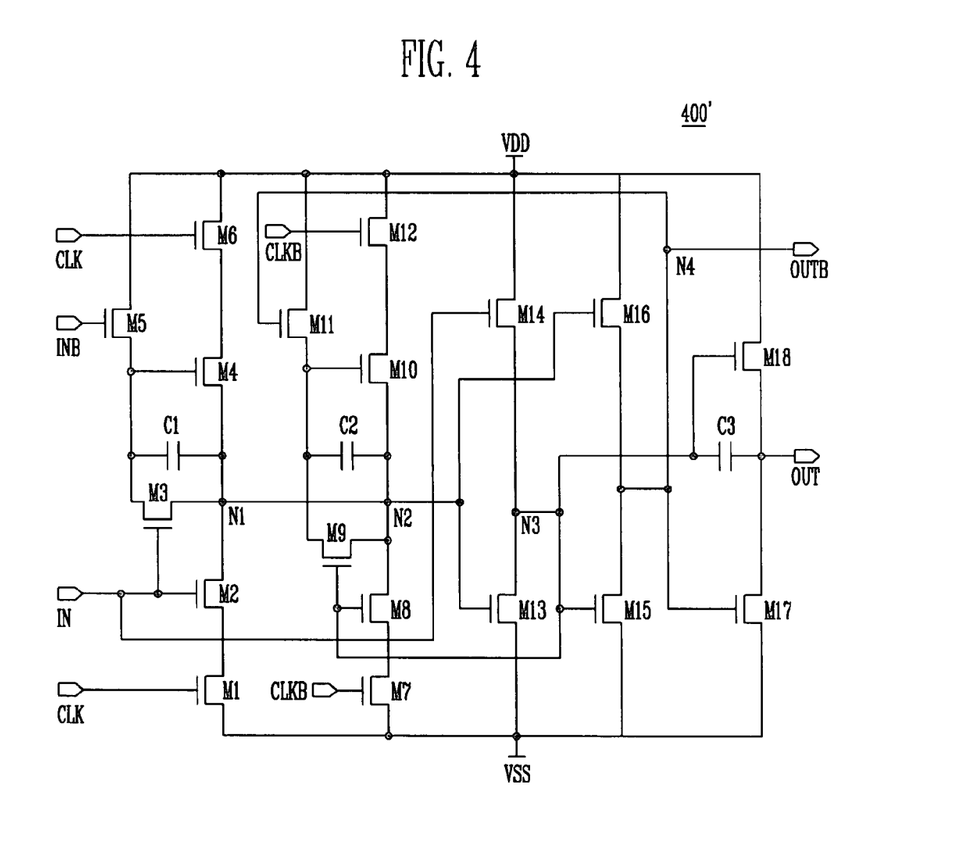
FIG. 4 illustrates a circuit diagram of a second exemplary embodiment of an emission driver employable by the display of FIG. 1.
Figure 5:
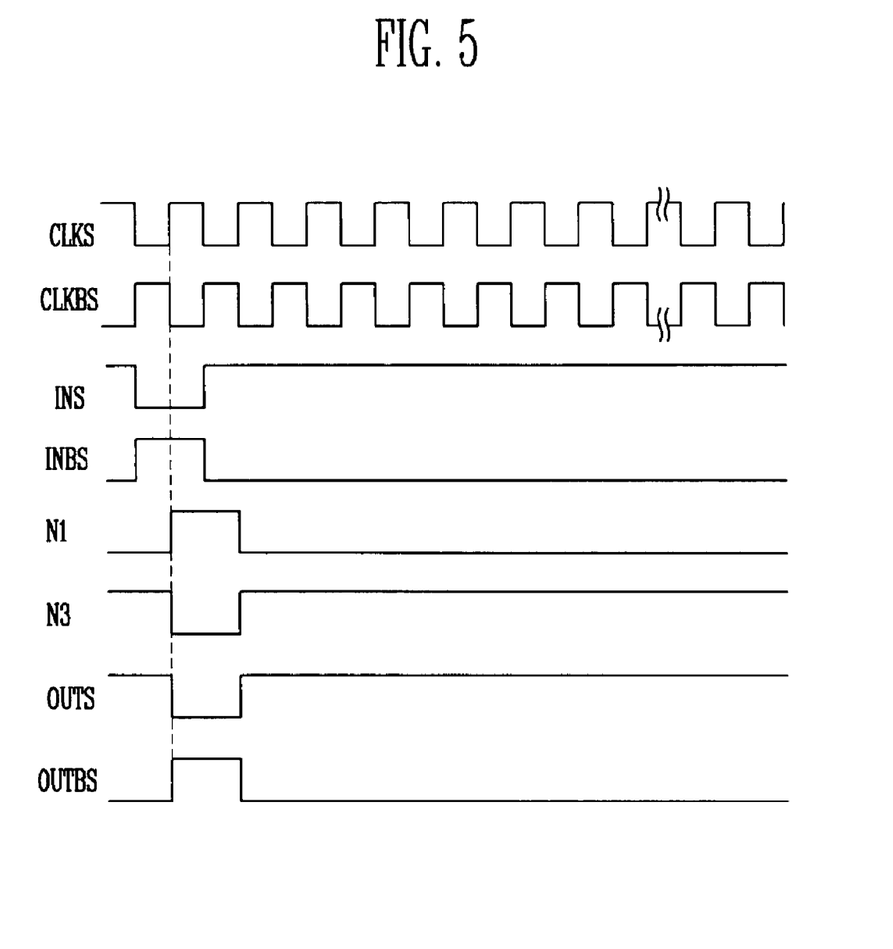
FIG. 5 illustrates a timing diagram of an exemplary operation of the emission driver of FIG. 4.

FIG. 4 illustrates a circuit diagram of a second exemplary embodiment of an emission driver 400' employable by the exemplary electroluminescent display of FIG. 1; and FIG. 5 illustrates a timing diagram of an exemplary operation of the emission driver 400' of FIG. 4.

Referring to FIG. 4, similar to the first exemplary emission driver 400 shown in FIG. 2, the second exemplary embodiment of the emission driver 400' may include a first signal processor, a second signal processor, a third signal processor, a fourth signal processor and a fifth signal processor. More particularly, the second exemplary emission driver 400' substantially corresponds to the first exemplary emission driver 400 described in detail above. However, the second exemplary emission driver 400' may include only n-type transistors, e.g., NMOS transistors, whereas the first exemplary emission driver 400 shown in FIG. 2 may include on p-type transistors, e.g., PMOS transistors. That is, in the second exemplary embodiment of one or more aspects of the invention, each of the first, second, third, fourth and fifth signal processors may only include n-type transistors, e.g., NMOS transistors. Thus, as may be seen in FIG. 5, signals that may be used to operate the second exemplary emission driver 400' may be inverse of those that may be used to operate the first exemplary emission driver 400.

The emission driver and the electroluminescent display, e.g., organic electroluminescent display, according to one or more aspects of the present invention may include an emission driver that includes one of p-type or n-type transistors so that a circuit of the emission driver may be formed on a substrate when forming a pixel unit of the substrate. Thus, embodiments of the invention may simplify a process of fabricating an emission driver and/or an electroluminescent display, e.g., an organic electroluminescent display, and/or may reduce a cost of manufacturing such an emission driver and/or electroluminescent display. Embodiments of the invention may separately reduce a size and/or a weight, etc., of the electroluminescent display.

Embodiments of the invention separately may provide an emission control signal having a voltage of the ground power source by decreasing a static current so that signal characteristic(s) of the emission control signal(s) may be improved, e.g., the signal characteristics of the emission control signal(s) may be excellent, and/or a width of a pulse of an output signal of the emission driver and a number of pulses thereof may be controlled based on an input signal supplied to the emission driver.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An emission driver, comprising:
    a first signal processor adapted to receive a clock signal, an input signal and an inverse input signal, and to generate a first output signal;
    a second signal processor adapted to receive the first output signal, an inverse clock signal and negative feedback signals, and to generate a second output signal;
    a third signal processor adapted to receive the second output signal and the input signal, and to generate a third output signal that is an inverse of the second output signal based on the input signal;
    a fourth signal processor adapted to receive the second output signal, and to generate a fourth output signal based on the second output signal, the fourth output signal being an inverse signal of the third output signal; and
    a fifth signal processor adapted to receive the fourth output signal, and to output a fifth output signal based on a stored predetermined voltage, the fifth output signal being an inverse of the fourth output signal,
    wherein the negative feedback signals include the third output signal and the fourth output signal.

2. The emission driver as claimed in claim 1, wherein the first output signal corresponds to the inverse input signal delayed for a predetermined period of time.

3. The emission driver as claimed in claim 1, wherein the second output signal corresponds to the first output signal corrected based on at least one of the negative feedback signals.

4. The emission driver as claimed in claim 1, wherein the fifth signal processor comprises a plurality of transistors, and the predetermined voltage is at least a threshold voltage of one of the plurality of transistors arranged between an output terminal of the emission driver from which the fifth output signal is supplied and a ground power source such that when the fifth output signal is at a low level, a voltage thereof is a voltage of the ground power source.

5. The emission driver as claimed in claim 1, wherein the first signal processor comprises:
    a first transistor adapted to control a supply of a driving source voltage corresponding to a driving power source based on the clock signal;
    a second transistor adapted to control the supply of the driving power source voltage supplied through the first transistor to a first node based on the input signal;
    a third transistor adapted to control current flow from the first node to a ground power source based on a voltage of a gate electrode thereof;
    a fourth transistor coupled between a source electrode and the gate electrode of the third transistor, and adapted to control a voltage between the source electrode and the gate electrode of the third transistor based on the input signal;
    a fifth transistor adapted to control a voltage of the gate electrode of the third transistor based on the inverse input signal;
    a sixth transistor coupled between the third transistor and the ground power source, and adapted to perform a switching operation based on the clock signal; and
    a first capacitor adapted to store a voltage corresponding to the gate electrode of the third transistor.

6. The emission driver as claimed in claim 1, wherein the second signal processor comprises:
    a seventh transistor coupled to a driving power source and adapted to perform a switching operation based on the inverse clock signal;
    an eighth transistor adapted to perform a switching operation based on the third output signal to transfer a driving source voltage corresponding to the driving power source supplied through the seventh transistor to a first node;
    a ninth transistor adapted to allow current to flow from a second node to a ground power source based on a voltage applied to a gate electrode thereof;
    a tenth transistor coupled between a source electrode and the gate electrode of the ninth transistor, and adapted to perform a switching operation based on the input signal to control a voltage between the source and the gate terminals of the ninth transistor;
    an eleventh transistor adapted to control the voltage of the gate electrode of the ninth transistor based on the fourth output signal;
    a twelfth transistor adapted to perform a switching operation based on the inverse clock signal to allow current to flow between the ninth transistor and the ground power source; and
    a second capacitor adapted to store the voltage of the gate electrode of the ninth transistor.

7. The emission driver as claimed in claim 1, wherein the third signal processor comprises:
    a thirteenth transistor adapted to perform a switching operation based on the second output signal to allow a voltage of a driving power source to be supplied to a third node; and
    a fourteenth transistor adapted to perform a switching operation based on the input signal to allow current to flow from the third node to a ground power source.

8. The emission driver as claimed in claim 1, wherein the fourth signal processor comprises:

a fifteenth transistor adapted to perform a switching operation based on the third output signal to allow a voltage of a driving power source to be supplied to a fourth node; and a sixteenth transistor adapted to perform a switching operation based on the second output signal to allow current to flow from the fourth node to a ground power source.

9. The emission driver as claimed in claim 1, wherein the fifth signal processor comprises:

a seventeenth transistor adapted to perform a switching operation based on the fourth output signal to supply a voltage corresponding to a driving power source to an output terminal of the emission driver;

an eighteenth transistor adapted to perform a switching operation based on the third output signal to allow current to flow from the output terminal to a ground power source; and a third capacitor adapted to store the predetermined voltage such that when the eighteenth transistor is in an on state and the seventeenth transistor is in an off state, a voltage of the output terminal is a voltage of the ground power source based on the predetermined voltage stored in the capacitor.

10. The emission driver as claimed in claim 1, wherein the first, second, third, fourth and fifth signal processors include a plurality of transistors and the plurality of transistors are all one of p-type transistors and n-type transistors, such that the first, second, third, fourth and fifth signal processors all include the same type of transistors.

11. An electroluminescent display, comprising:

a pixel unit adapted to display an image based on at least one pixel formed in a region defined by a data line, a scan line and an emission control line;

a data driver adapted to transfer a data signal to the data line;

a scan driver adapted to transfer a scan signal to the scan line; and an emission driver adapted to transfer an emission control signal to the emission control line, wherein the emission driver includes:

a first signal processor adapted to receive a clock signal, an input signal and an inverse input signal, and to generate a first output signal;

a second signal processor adapted to receive the first output signal, an inverse clock signal and negative feedback signals, and to generate a second output signal;

a third signal processor adapted to receive the second output signal and the input signal, and to generate a third output signal that is an inverse of the second output signal based on the input signal;

a fourth signal processor adapted to receive the second output signal, and to generate a fourth output signal based on the second output signal, the fourth output signal being an inverse signal of the third output signal; and a fifth signal processor adapted to receive the fourth output signal, and to output a fifth output signal based on a stored predetermined voltage, the fifth output signal being an inverse of the fourth output signal, wherein the negative feedback signals include the third output signal and the fourth output signal.

12. The electroluminescent display as claimed in claim 11, wherein the first output signal corresponds to the inverse input signal delayed for a predetermined period of time.

13. The electroluminescent display as claimed in claim 11, wherein the second output signal corresponds to the first output signal corrected based on at least one of the negative feedback signals.

14. The electroluminescent display as claimed in claim 11, wherein the first signal processor includes:

a first transistor adapted to control a supply of a driving source voltage corresponding to a driving power source based on the clock signal;

a second transistor adapted to control the supply of the driving power source voltage supplied through the first transistor to a first node based on the input signal;

a third transistor adapted to control current flow from a first node to a ground power source based on a voltage of a gate electrode thereof;

a fourth transistor coupled between a source electrode and the gate electrode of the third transistor, and adapted to control a voltage between the source electrode and the gate electrode of the third transistor based on the input signal;

a fifth transistor adapted to control a voltage of the gate electrode of the third transistor based on the inverse input signal;

a sixth transistor coupled between the third transistor and the ground power source, and adapted to perform a switching operation based on the clock signal; and a first capacitor adapted to store a voltage corresponding to the gate electrode of the third transistor.

15. The electroluminescent display as claimed in claim 11, wherein the second signal processor includes:

a seventh transistor coupled to a driving power source and adapted to perform a switching operation based on the inverse clock signal;

an eighth transistor adapted to perform a switching operation based on the third output signal to transfer a driving source voltage corresponding to the driving power source supplied through the seventh transistor to a first node;

a ninth transistor adapted to allow current to flow from a second node to a ground power source based on a voltage applied to a gate electrode thereof;

a tenth transistor coupled between a source electrode and the gate electrode of the ninth transistor, and adapted to perform a switching operation based on the input signal to control a voltage between the source and the gate terminals of the ninth transistor;

an eleventh transistor adapted to control the voltage of the gate electrode of the ninth transistor based on the fourth output signal;

a twelfth transistor adapted to perform a switching operation based on the inverse clock signal to allow current to flow between the ninth transistor and the ground power source; and a second capacitor adapted to store the voltage of the gate electrode of the ninth transistor.

16. The electroluminescent display as claimed in claim 11, wherein the third signal processor includes:

a thirteenth transistor adapted to perform a switching operation based on the second output signal to allow a voltage of a driving power source to be supplied to a third node; and a fourteenth transistor adapted to perform a switching operation based on the input signal to allow current to flow from the third node to a ground power source.

17. The electroluminescent display as claimed in claim 11, wherein the fourth signal processor includes:

a fifteenth transistor adapted to perform a switching operation based on the third output signal to allow a voltage of a driving power source to be supplied to a fourth node; and a sixteenth transistor adapted to perform a switching operation based on the second output signal to allow current to flow from the fourth node to a ground power source.

18. The electroluminescent display as claimed in claim 11, wherein the fifth signal processor includes:

a seventeenth transistor adapted to perform a switching operation based on the fourth output signal to supply a voltage corresponding to a driving power source to an output terminal of the emission driver;

an eighteenth transistor adapted to perform a switching operation based on the third output signal to allow current to flow from the output terminal to a ground power source; and a third capacitor adapted to store the predetermined voltage such that when the eighteenth transistor is in an on state and the seventeenth transistor is in an off state, a voltage of the output terminal is a voltage of the ground power source based on the predetermined voltage stored in the capacitor.

19. The electroluminescent display as claimed in claim 11, wherein the first, second, third, fourth and fifth signal processors include a plurality of transistors and the plurality of transistors are all one of p-type transistors and n-type transistors such that the first, second, third, fourth and fifth signal processors all include the same type of transistors.

20. The electroluminescent display as claimed in claim 11, wherein the electroluminescent display is an organic electroluminescent display.

* * * * *